United States Patent
Wells et al.

(10) Patent No.: US 9,349,445 B2
(45) Date of Patent: May 24, 2016

(54) SELECT DEVICES FOR MEMORY CELL APPLICATIONS

(75) Inventors: David H. Wells, Boise, ID (US);
Bhaskar Srinivasan, Boise, ID (US);
John K. Zahurak, Eagle, ID (US)

(73) Assignee: Micron Technology, Inc., Boise, ID (US)

( * ) Notice: Subject to any disclaimer, the term of this patent is extended or adjusted under 35 U.S.C. 154(b) by 991 days.

(21) Appl. No.: 13/234,659

(22) Filed: Sep. 16, 2011

(65) Prior Publication Data
US 2013/0069028 A1 Mar. 21, 2013

(51) Int. Cl.
*G11C 13/00* (2006.01)
*H01L 21/28* (2006.01)
*H01L 27/102* (2006.01)
*H01L 29/872* (2006.01)
*H01L 45/00* (2006.01)
*H01L 27/24* (2006.01)

(52) U.S. Cl.
CPC .......... *G11C 13/0007* (2013.01); *G11C 13/003* (2013.01); *G11C 13/0004* (2013.01); *H01L 21/28* (2013.01); *H01L 27/1021* (2013.01); *H01L 27/2418* (2013.01); *H01L 27/2463* (2013.01); *H01L 29/872* (2013.01); *H01L 45/04* (2013.01); *H01L 45/06* (2013.01); *H01L 45/1233* (2013.01); *G11C 2213/54* (2013.01)

(58) Field of Classification Search
CPC ...... H01L 21/28; H01L 21/8239; H01L 45/04
USPC .............................................. 257/2; 365/171
See application file for complete search history.

(56) References Cited

U.S. PATENT DOCUMENTS

| | | | |
|---|---|---|---|
| 5,686,341 A | 11/1997 | Roesner | |
| 6,944,052 B2 * | 9/2005 | Subramanian et al. | 365/171 |
| 7,608,514 B2 | 10/2009 | Hsu et al. | |
| 7,764,477 B2 | 7/2010 | Tang et al. | |
| 7,884,349 B2 * | 2/2011 | Rinerson et al. | 257/5 |
| 7,888,240 B2 | 2/2011 | Hamamjy et al. | |
| 7,897,951 B2 | 3/2011 | Rinerson et al. | |
| 7,957,207 B2 | 6/2011 | Parkinson | |
| 9,224,949 B2 * | 12/2015 | Yang | H01L 27/0688 |
| 2004/0016923 A1 | 1/2004 | Yu et al. | |
| 2006/0250837 A1 | 11/2006 | Herner et al. | |
| 2007/0015348 A1 | 1/2007 | Hsu et al. | |
| 2007/0080345 A1 | 4/2007 | Joo et al. | |
| 2008/0278990 A1 | 11/2008 | Kumar et al. | |
| 2008/0310209 A1 | 12/2008 | Liu et al. | |
| 2009/0032817 A1 | 2/2009 | Li et al. | |

(Continued)

OTHER PUBLICATIONS

Chshiev et al. Magnetic diode effect in double-barrier tunnel junctions. Europhys. Lett., 58 (2), pp. 257-263 (2002).*

(Continued)

*Primary Examiner* — Matthew Landau
*Assistant Examiner* — Eric Ashbahian
(74) *Attorney, Agent, or Firm* — Brooks, Cameron & Huebsch, PLLC (57) ABSTRACT

Select devices for memory cell applications and methods of forming the same are described herein. As an example, one or more non-ohmic select devices can include at least two tunnel barrier regions formed between a first metal material and a second metal material, and a third metal material formed between each of the respective at least two tunnel barrier regions. The non-ohmic select device is a two terminal select device that supports bi-directional current flow therethrough.

28 Claims, 4 Drawing Sheets

(56) References Cited

U.S. PATENT DOCUMENTS

| | | | |
|---|---|---|---|
| 2009/0224224 | A1 | 9/2009 | Fujii et al. |
| 2010/0102298 | A1 | 4/2010 | Wu |
| 2010/0123542 | A1 | 5/2010 | Vaithyanathan et al. |
| 2010/0157666 | A1 | 6/2010 | Parkinson |
| 2010/0162067 | A1 | 6/2010 | Norman |
| 2010/0265762 | A1* | 10/2010 | Cheung et al. ............ 365/163 |
| 2010/0315866 | A1 | 12/2010 | Park et al. |
| 2011/0006276 | A1 | 1/2011 | Kim et al. |
| 2011/0007544 | A1 | 1/2011 | Vaithyanathan et al. |
| 2011/0007551 | A1 | 1/2011 | Tian et al. |
| 2011/0051494 | A1 | 3/2011 | Kohlstedt |
| 2011/0062408 | A1 | 3/2011 | Kozicki |
| 2011/0069529 | A1 | 3/2011 | Srinivasan et al. |
| 2011/0133149 | A1* | 6/2011 | Sonehara ..................... 257/3 |
| 2011/0134685 | A1 | 6/2011 | Kau et al. |
| 2011/0186801 | A1* | 8/2011 | Yang et al. .................. 257/4 |
| 2011/0194338 | A1 | 8/2011 | Baek et al. |
| 2011/0220876 | A1* | 9/2011 | Nishizawa et al. ........... 257/30 |
| 2011/0260131 | A1* | 10/2011 | Sonehara ..................... 257/2 |
| 2012/0080665 | A1 | 4/2012 | Blom et al. |
| 2013/0001494 | A1 | 1/2013 | Chen et al. |
| 2013/0069030 | A1 | 3/2013 | Wells et al. |
| 2013/0070511 | A1 | 3/2013 | Wells et al. |

OTHER PUBLICATIONS

Madelung, Otfried. Semiconductors—Basic Data (2nd revised Edition). Springer-Verlag Berlin Heidelberg 1991, p. 239.*

Lee et al., "2-Stack 1D-1R Cross-point Structure with Oxide Diodes as Switch Elements for High Density Resistance RAM Applications," Electron Devices Meeting, IEDM 2007, IEEE International, pp. 771-774, Dec. 10-12, 2007.

Jo, "Nanoscale Memristive Devices for Memory and Logic Applications," PhD Dissertation at Univ. of Michigan, 2010, found online at http://deepblue.lib.umich.edu/handle/2027.42/75835, 19 pp.

Restriction Requirement from U.S. Appl. No. 13/234,771, dated Jun. 18, 2013, 5 pp.

Non-Final Office Action from U.S. Appl. No. 13/234,771, dated Nov. 6, 2013, 16 pp.

Non-Final Office Action from U.S. Appl. No. 13/234,875, dated Apr. 5, 2013, 19 pp.

Final Office Action from U.S. Appl. No. 13/234,875, dated Aug. 2, 2013, 22 pp.

Non-Final Office Action from U.S. Appl. No. 13/234,875, dated Oct. 28, 2013, 18 pp.

Non-Final Office Action from U.S. Appl. No. 13/234,875, dated Dec. 26, 2014, 11 pp.

Non-Final Office Action from U.S. Appl. No. 13/234,875, dated Aug. 1, 2014, 16 pp.

* cited by examiner

SELECT DEVICES FOR MEMORY CELL APPLICATIONS

TECHNICAL FIELD

The present disclosure relates generally to semiconductor memory devices and methods, and more particularly, to select devices for memory cell applications.

BACKGROUND

Memory devices are typically provided as internal, semiconductor, integrated circuits in computers or other electronic devices. There are many different types of memory, including random-access memory (RAM), read only memory (ROM), dynamic random access memory (DRAM), synchronous dynamic random access memory (SDRAM), resistive memory, and flash memory, among others. Types of resistive memory include programmable conductor memory, and resistive random access memory (RRAM), among others.

Memory devices are utilized as non-volatile memory for a wide range of electronic applications in need of high memory densities, high reliability, and data retention without power. Non-volatile memory may be used in, for example, personal computers, portable memory sticks, solid state drives (SSDs), digital cameras, cellular telephones, portable music players such as MP3 players, movie players, and other electronic devices.

RRAM devices include resistive memory cells that store data based on the resistance level of a storage element. The cells can be programmed to a desired state, e.g., corresponding to a particular resistance level, such as by applying sources of energy, such as positive or negative voltages to the cells for a particular duration. Some RRAM cells can be programmed to multiple states such that they can represent, e.g., store, two or more bits of data.

The programmed state of a resistive memory cell may be determined, e.g., read, for example, by sensing current through the selected resistive memory cell responsive to an applied interrogation voltage. The sensed current, which varies based on the resistance level of the memory cell, can indicate the programmed state of the resistive memory cell.

In various instances, arrays of resistive memory cells can be prone to read disturbance problems. For instance, as part of a read operation, current can flow from a selected access line, e.g., word line, through a selected memory cell, to a data/sense line, e.g., bit line. However, in various array architectures such as cross-point architectures, current also flows into unselected word lines that cross over the selected bit line. Conduction of current into unselected word lines can reduce the ability to distinguish between data states, e.g., by decreasing output impedance, among other drawbacks.

DETAILED DESCRIPTION

Select devices for memory cell applications and methods of forming the same are described herein. As an example, one or more non-ohmic select devices can include at least two tunnel barrier regions formed between a first metal material and a second metal material, and a third metal material formed between each of the respective at least two tunnel barrier regions. The non-ohmic select device is a two terminal select device that supports bi-directional current flow therethrough.

Embodiments of the present disclosure can include benefits such as providing a bi-directional select device useful for memory applications such as resistive memory applications, for instance. As an example, one or more select devices in accordance with the present disclosure can be formed at temperatures sufficiently low to support 3D stacking of memory arrays such as RRAM arrays. Various embodiments provide non-ohmic select devices having a high on current versus off current ratio (Ion/Ioff) in association with a half select read method. That is, Ion/Ioff at an on voltage (Von) associated with the memory array is much greater than Ion/Ioff at a corresponding half select voltage (Von/2). As an example, Ion/Ioff at Von can be at least $1 \times 10^4$ times greater than the Ion/Ioff at Von/2, in some embodiments. One or more select devices according to the present disclosure can act as a current limiter to permit high voltage bipolar programming without flowing current into unselected word lines during lower voltage read operations. As an example, embodiments of the present disclosure can support current densities on the order of $10^6$ or $10^7$ A/cm$^2$, which can be higher than other prior art select devices such as metal-insulator-metal (MIM) select devices or metal-semiconductor-metal (MSM) select devices, for instance.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure.

The figures herein follow a numbering convention in which the first digit or digits correspond to the drawing figure number and the remaining digits identify an element or component in the drawing. Similar elements or components between different figures may be identified by the use of similar digits. As will be appreciated, elements shown in the various embodiments herein can be added, exchanged, and/or eliminated so as to provide a number of additional embodiments of the present disclosure. In addition, the proportion and the relative scale of the elements provided in the figures are intended to illustrate various embodiments of the present disclosure and are not to be used in a limiting sense.

Figure 1:
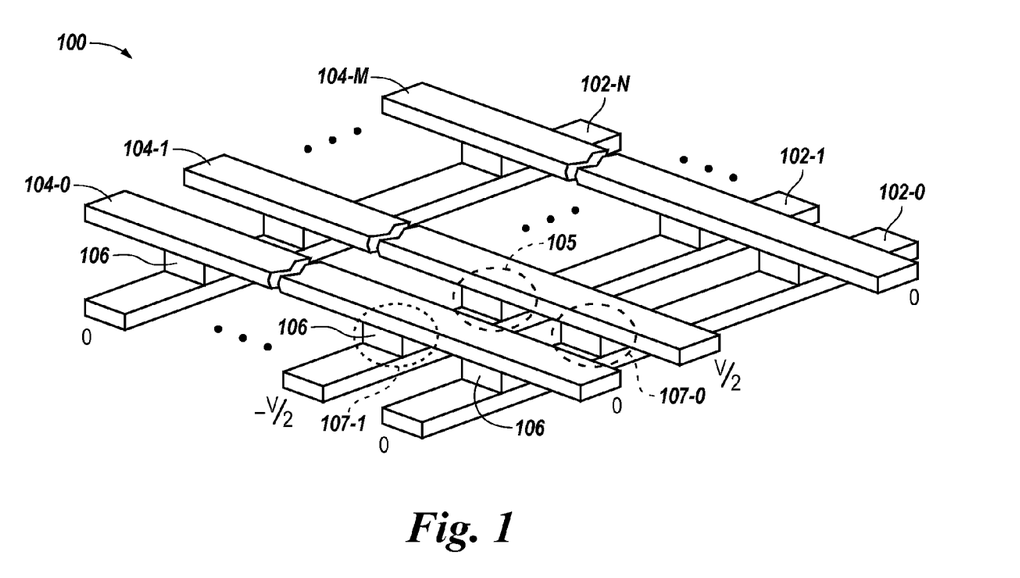
FIG. 1 is a block diagram of a portion of an array of resistive memory cells in accordance with one or more embodiments of the present disclosure.

FIG. 1 is a block diagram of a portion of an array 100 of memory cells 106 in accordance with one or more embodiments of the present disclosure. The array 100 is a two terminal cross-point array having memory cells 106 located at the intersections of a number of access lines 102-0, 102-1, ..., 102-N, which may be referred to herein as word lines, and a number of data/sense lines 104-0, 104-1, ..., 104-M, which may be referred to herein as bit lines. As illustrated, the word lines 102-0, 102-1, ..., 102-N are parallel to each other and are orthogonal to the bit lines 104-0, 104-1, ..., 104-M, which are substantially parallel to each other; however, embodiments are not so limited.

Each memory cell 106 may include a storage element, e.g., a resistive memory element coupled in series with a select device, e.g., an access device, in accordance with one or more embodiments described herein. The storage element can include a programmable portion that may have a variable resistance, for example. The storage element can include, for example, one or more resistance variable materials such as a transition metal oxide material or a perovskite including two or more metals, e.g., transition metals, alkaline earth metals, and/or rare earth metals. Other examples of resistance variable materials associated with the storage element of a memory cell 106 can include chalcogenides, binary metal oxides, colossal magnetoresistive materials, and/or various polymer-based resistive variable materials, among others.

In one or more embodiments, the select device corresponding to each memory cell is a non-ohmic two terminal select device including at least two tunnel barrier regions formed between a first metal material and a second metal material, with a third metal material formed between each of the respective at least two tunnel barrier regions. The first and second metal materials can correspond to the two terminals, e.g., electrodes, of the select device. The metal material formed between the tunnel barrier regions can be referred to as a metal interlayer and can be configured, e.g., tailored, such that its thickness can prevent coupled tunneling between the tunnel barrier regions responsive to sufficiently low applied voltages but can allow energetic electrons to transit the metal material responsive to sufficiently high applied voltages. The particular characteristics of select devices in accordance with one or more embodiments of the present disclosure are described further in connection with FIGS. 2-7.

As an example, the array 100 can be operated in accordance with a half select method. A half select method can include applying a half select voltage (V/2) to a selected bit line, e.g., a bit line coupled to a selected memory cell, and a negative half select voltage (−V/2) to a selected word line, e.g., a word line coupled to the selected memory cell, while biasing unselected word lines at a reference potential, e.g., a ground potential. In the example illustrated in FIG. 1, memory cell 105 is a selected memory cell. That is, selected memory cell 105 is coupled to a selected bit line 104-1 biased at V/2 and a selected word line 102-1 biased at −V/2. As such, the full select voltage (V) is applied across the selected memory cell 105. The unselected memory cells coupled to the selected bit line 104-1 and selected word line 102-1, e.g., unselected memory cells 107-0 and 107-1, experience a half select voltage of +/−V/2 and can be referred to as "half selected" cells. The unselected memory cells coupled to unselected bit lines and/or word lines are unbiased, e.g., they experience a ground potential of 0V, in this example. The select voltage (V) can be a write voltage or a read voltage, for instance.

It can be beneficial for select devices to provide a half select ratio (HSR) that is as large as possible. The HSR can refer to the ratio of the current flowing through a selected memory cell, e.g., 105-1, to the current flowing through a half selected memory cell, e.g., 107-0 and 107-1. As described further below, select devices in accordance with one or more embodiments can provide a half select ratio of $10^4$:1 or $10^5$:1 or larger, for example. The larger the HSR, the lower the power dissipation caused by current flow in half-selected memory cells, e.g., 107-0 and 107-1, and the greater the signal to noise ratio (S/N) during read and/or write operations, which can reduce the likelihood of read and/or write disturb to half selected memory cells. The half select method is provided as one example and embodiments are not limited to a particular programming and/or read method.

In various embodiments, the select devices corresponding to memory cells 106 of array 100 can be "bipolar" in that they permit bi-directional current flow, e.g., in both forward and reverse directions, under sufficiently high voltage bias conditions, but block current flow under lower voltage conditions. The select devices can have an associated I(current)-V (voltage) curve, which can be symmetric, and can have an associated differential resistance that decreases with increasing voltage, e.g., as illustrated in the example shown in FIG. 7.

Figure 2:
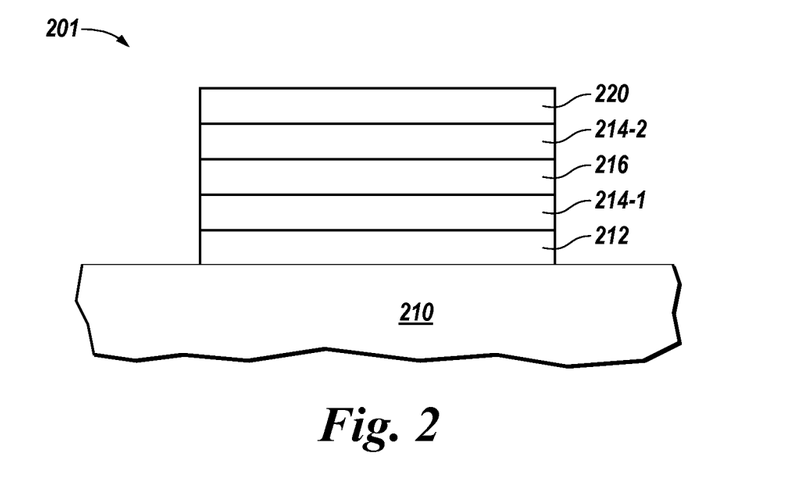
FIG. 2 illustrates a cross-sectional view of a non-ohmic two terminal select device in accordance with one or more embodiments of the present disclosure.

FIG. 2 illustrates a cross-sectional view of a non-ohmic two terminal select device 201 in accordance with one or more embodiments of the present disclosure. The select device 201 includes a metal material 212 formed on a substrate 210. The substrate 210 can be a silicon substrate, silicon on insulator (SOI) substrate, or silicon on sapphire (SOS) substrate, among various other substrate materials.

A first tunnel barrier region 214-1 is formed on the metal material 212. A metal material 216 is formed on the tunnel barrier region 214-1 and a second tunnel barrier region 214-2 is formed on the metal material 216. A metal material 220 is formed on the tunnel barrier region 214-2. In various embodiments, the metal materials 212 and 220 can serve as the two terminals of the select device 201. The metal materials 212 and 220 can be materials such as titanium nitride (TiN), tantalum nitride (TaN), platinum, and/or a metal silicide, among various other metal materials. In various embodiments, the thickness of the materials 212 and 220 is less than about 200 Angstroms.

Figure 3:
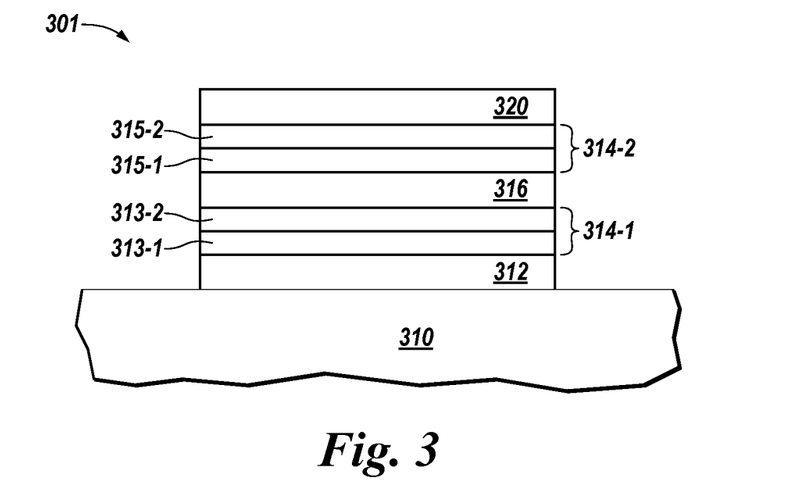
FIG. 3 illustrates a cross-sectional view of a non-ohmic two terminal select device in accordance with one or more embodiments of the present disclosure.

The tunnel barrier regions 214-1 and 214-2 can be a semiconductor material such as silicon and/or germanium, for instance, and the semiconductor materials may be doped or undoped. In such embodiments, Schottky barrier junctions can be formed at the interface between semiconductor material 214-1 and metal material 212, at the interface between the semiconductor 214-1 and metal material 216, at the interface between the semiconductor material 214-2 and the metal material 216, and at the interface between the semiconductor material 214-2 and the metal material 220. As illustrated in FIG. 3, the tunnel barrier regions, e.g., 214-1 and 214-2, can each include more than one material, e.g., at least two different material layers, for instance. As an example, the tunnel barrier regions 214-1 and 214-2 can each include multiple different dielectric materials. The tunnel barrier regions 214-1 and 214-2 have a thickness of not greater than about 100 Angstroms, in various embodiments.

The metal material 216 can be a material such as tantalum nitride (TaN), tantalum silicon nitride (TaSiN), titanium nitride (TiN), and/or a metal silicide, among various other metal materials. The metal material 216 can be configured to prevent coupled electron tunneling between the tunnel barrier materials 214-1 and 214-2 at sufficiently low voltages but can be thin enough to allow energetic electrons to transit the metal 216 at sufficiently high voltages. In various embodiments, the thickness of metal material 216 is not greater than about 50 Angstroms. In one or more embodiments, the thickness of metal material 216 is not greater than about 20 Angstroms. In various embodiments, the work function of the metal material 216 is less than the work function of the metal materials 212 and 220.

The particular types of materials and thicknesses associated with select device 201 can depend on factors such as the characteristics of a memory cell associated with the select device 201. For instance, the particular characteristics of the select device 201, e.g., particular types of materials and thicknesses, can depend on a particular type of resistive memory cell and/or type of resistance variable material associated therewith. As such, the characteristics of the select device 201 can be tailored to achieve suitable differential resistance and I-V curve characteristics corresponding to a particular type of memory cell, e.g., RRAM, PCRAM, etc. As an example, the select device 201 can be tailored such that an on/off current ratio (Ion/Ioff) associated with the select device 201 responsive to a select voltage corresponding to a half select method, such as that described in FIG. 1, can be at least about $1\times10^4$ times greater than Ion/Ioff responsive to a half select voltage applied across the device 201. The Ion/Ioff ratio associated with select devices such as device 201 can be greater than the Ion/Ioff ratio associated with previous select devices, e.g., select devices having a metal-semiconductor-metal (MSM) configuration, metal-insulator-metal (MIM) configuration, metal-insulator-insulator-metal (MIIM) configuration, or metal-insulator-insulator-insulator-metal (MIIIM) configuration, etc. Select devices in accordance with embodiments described herein, such as select device 201, can provide such an Ion/Ioff ratio while supporting a higher current density as compared to such previous select devices. As an example, select devices such as the two terminal non-ohmic select device 201 can have an associated breakdown current density of at least $1\times10^5$ A/cm$^2$, for instance.

FIG. 3 illustrates a cross-sectional view of a non-ohmic two terminal select device 301 in accordance with one or more embodiments of the present disclosure. The select device 301 includes a metal material 312 formed on a substrate 310. The substrate 310 can be a silicon substrate, silicon on insulator (SOI) substrate, or silicon on sapphire (SOS) substrate, among various other substrate materials.

A first tunnel barrier region 314-1 is formed on the metal material 312. A metal material 316 is formed on the tunnel barrier region 314-1 and a second tunnel barrier region 314-2 is formed on the metal material 316. A metal material 320 is formed on the tunnel barrier region 314-2. The metal materials 312 and 320 can serve as the two terminals, e.g., electrodes, of the select device 301. The metal materials 312 and 320 can be materials such as titanium nitride (TiN), tantalum nitride (TaN), platinum, and/or a metal silicide, among various other metal materials. In various embodiments, the thickness of the materials 312 and 320 is less than about 200 Angstroms.

The tunnel barrier regions 314-1 and 314-2 can each include at least two different materials. As an example, the tunnel barrier regions 314-1 and 314-2 can each include multiple different dielectric, e.g., insulator, materials. For instance, the tunnel barrier region 314-1 includes dielectric materials 313-1 and 313-2 and the tunnel barrier region 314-2 includes dielectric materials 315-1 and 315-2. As such, the select device 301 has a metal-insulator-insulator-metal-insulator-insulator-metal (MIIMIIM) configuration. The dielectric materials can be materials such as silicon dioxide (SiO2) or zirconium dioxide (ZrO2), among various other dielectric materials. In one or more embodiments, the materials 313-1 and 315-2 are the same dielectric material, which is different from the materials 313-2 and 315-1, which are the same dielectric material. As an example, in such embodiments, the dielectric constant of material 313-2 and 315-1 can be greater than the dielectric constant of material 313-1 and 315-2. Also, in such embodiments, the band gap of material 313-2 and 315-1 can be lower than the band gap of material 313-1 and 315-2. However, embodiments are not so limited. For instance, in one or more embodiments, the materials 313-2 and 315-1 can be different dielectric materials. Similarly, the materials 313-1 and 315-2 can be different dielectric materials, in one or more embodiments. In various embodiments, the tunnel barrier regions 314-1 and 314-2 have a thickness of not greater than about 100 Angstroms.

The metal material 316 can be a material such as tantalum nitride (TaN), tantalum silicon nitride (TaSiN), titanium nitride (TiN), and/or a metal silicide, among various other metal materials. The metal material 316 can be configured to prevent coupled electron tunneling between the tunnel barrier materials 314-1 and 314-2 at sufficiently low voltages but can be thin enough to allow energetic electrons to transit the metal 316 at sufficiently high voltages. In various embodiments, the thickness of metal material 316 is not greater than about 50 Angstroms. In one or more embodiments, the thickness of metal material 316 is not greater than about 20 Angstroms. In various embodiments, the work function of the metal material 316 is less than the work function of the metal materials 312 and 320.

As described above in connection with FIG. 2, the particular types of materials and thicknesses associated with select device 301 can depend on various factors, such as the characteristics of a memory cell associated with the select device 301, for instance. As such, the characteristics of the select device 301 can be tailored to achieve suitable differential resistance and I-V curve characteristics corresponding to a particular type of memory cell, e.g., RRAM, PCRAM, etc.

Figure 4:
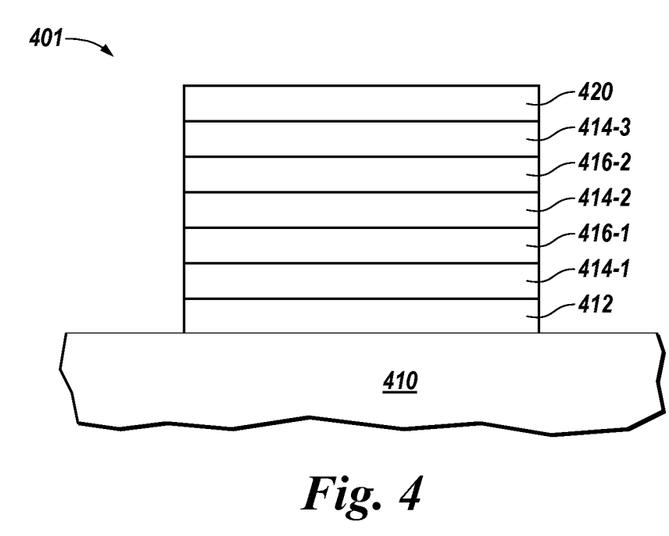
FIG. 4 illustrates a cross-sectional view of a non-ohmic two terminal select device in accordance with one or more embodiments of the present disclosure.

FIG. 4 illustrates a cross-sectional view of a non-ohmic two terminal select device 401 in accordance with one or more embodiments of the present disclosure. One or more select devices can include at least three tunnel barrier regions formed between a pair of electrodes. The select device 401 includes three tunnel barrier regions 414-1, 414-2, and 414-3 formed between a first and a second metal electrode 412 and 420. In this example, a metal material is formed between each of the tunnel barrier regions 414-1, 414-2, and 414-3. That is, a metal material 416-1 is formed between tunnel barrier regions 414-1 and 414-2, and a metal material 416-2 is formed between the tunnel barrier regions 414-2 and 414-3.

The electrode 412 of select device 401 is formed on a substrate 410, which can be a silicon substrate, silicon on insulator (SOI) substrate, or silicon on sapphire (SOS) substrate, among various other substrate materials. In this example, the tunnel barrier region 414-1 is formed on the electrode 412, the metal material 416-1 is formed on the tunnel barrier region 414-1, the tunnel barrier region 414-2 is formed on the metal material 416-1, the metal material 416-2 is formed on the tunnel barrier region 414-2, the tunnel barrier region 414-3 is formed on the metal material 416-2, and the electrode 420 is formed on the tunnel barrier region 414-3.

The tunnel barrier regions 414-1, 414-2, and 414-3 can be one or more semiconductor materials such as silicon and/or germanium, for instance, and the semiconductor materials may be doped or undoped. As such, the select device 401 can have a metal-semiconductor-metal-semiconductor-metal-semiconductor-metal (MSMSMSM) configurations. In such embodiments, Schottky barrier junctions can be formed at the interfaces between the respective semiconductor materials 414-1, 414-2, and 414-3 and respective metal materials 416-1, 416-2, 412, and 420. The tunnel barrier regions 414-1, 414-2, and 414-3 have a thickness of not greater than about 100 Angstroms, in various embodiments. In one or more embodiments, the tunnel barrier region 414-2 can be an undoped semiconductor material, e.g., intrinsic polysilicon, and the tunnel barrier regions 414-1 and 414-3 can be doped semiconductor materials, e.g., doped silicon.

The metal materials 416-1 and 416-2 can be a material such as tantalum nitride (TaN), tantalum silicon nitride (TaSiN), titanium nitride (TiN), and/or a metal silicide, among various other metal materials. The metal materials 416-1 and 416-2 can be configured to prevent coupled electron tunneling between the tunnel barrier materials 414-1, 414-2, and 414-3 at sufficiently low voltages but can be thin enough to allow energetic electrons to transit the metals 416-1 and 416-2 at sufficiently high-voltages. In various embodiments, the thickness of metal materials 416-1 and 416-2 is not greater than about 50 Angstroms. In one or more embodiments, the thickness of metal materials 416-1 and 416-2 is not greater than about 20 Angstroms. In various embodiments, the work function of the metal materials 416-1 and 416-2 is less than the work function of the electrode materials 412 and 420.

As described above in connection with FIGS. 2 and 3, the particular types of materials and thicknesses associated with select device 401 can depend on various factors, such as the characteristics of a memory cell associated with the select device 401, for instance. As such, the characteristics of the select device 401 can be tailored to achieve suitable differential resistance and I-V curve characteristics corresponding to a particular type of memory cell, e.g., RRAM, PCRAM, etc. The select devices described above in connection with FIGS. 2, 3, and 4 can be associated with a memory cell such as memory cell 106 described in FIG. 1, for instance.

Figure 5:
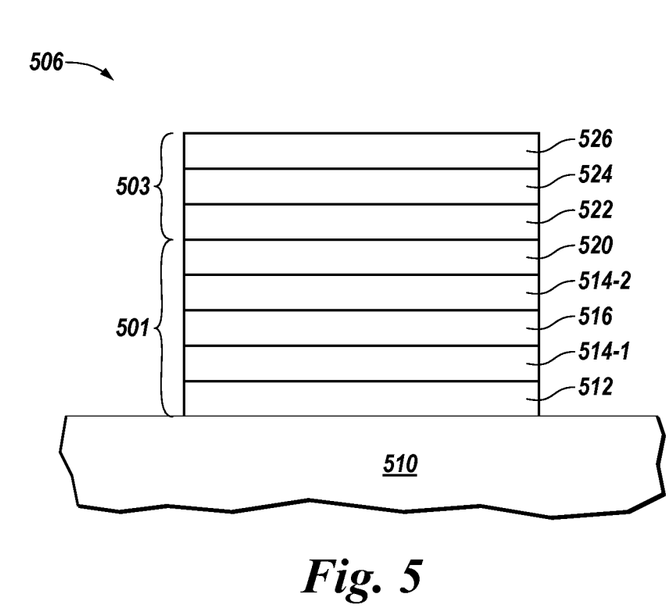
FIG. 5 illustrates a cross-sectional view of a resistive memory cell including a non-ohmic two terminal select device in accordance with one or more embodiments of the present disclosure.

FIG. 5 illustrates a cross-sectional view of a resistive memory cell 506 including a non-ohmic two terminal select device 501 in accordance with one or more embodiments of the present disclosure. The memory cell 506 can be a memory cell such as memory cell 106 of array 100 shown in FIG. 1. As illustrated in FIG. 5, the select device 501 is electrically in series with a resistive memory element 503.

In various embodiments, a resistive memory cell includes a select device having at least two tunnel barrier regions formed between a first select device electrode and a second select device electrode and a metal material formed between each of the respective at least two tunnel barrier regions. The resistive memory cell also includes a resistive memory element having a memory material formed between a first memory element electrode and a second memory element electrode, with the second memory element electrode in contact with the second select device electrode. In one or more such embodiments, the first select device electrode can serve as a first cell terminal and the first memory element electrode can serve as a second cell terminal.

The select device 501 of memory cell 506 can be analogous to the select device 201 described in FIG. 2. As such, the select device 501 includes a metal material 512, e.g., a first select device electrode 512, formed on a substrate 510. The substrate 510 can be a silicon substrate, silicon on insulator (SOI) substrate, or silicon on sapphire (SOS) substrate, among various other substrate materials.

A first tunnel barrier region 514-1 is formed on the select device electrode 512. A metal material 516, e.g., a metal interlayer, is formed on the tunnel barrier region 514-1 and a second tunnel barrier region 514-2 is formed on the metal material 516. A metal material 520, e.g., a second select device electrode 520, is formed on the tunnel barrier region 514-2. The metal materials 512 and 520 can serve as the two terminals of the select device 501.

The tunnel barrier regions 514-1 and 514-2 can be a semiconductor material such as silicon and/or germanium, for instance, and the semiconductor materials may be doped or undoped. In such embodiments, Schottky barrier junctions can be formed at the interface between semiconductor material 514-1 and metal material 512, at the interface between the semiconductor 514-1 and metal material 516, at the interface between the semiconductor material 514-2 and the metal material 516, and at the interface between the semiconductor material 514-2 and the metal material 520. In various embodiments, the tunnel barrier regions, e.g., 514-1 and 514-2, can each include more than one material, e.g., two or more different material layers, for instance.

The metal material 516 can be a material such as tantalum nitride (TaN), tantalum silicon nitride (TaSiN), titanium nitride (TiN), and/or a metal silicide, among various other metal materials. The metal material 516 can be configured to prevent coupled electron tunneling between the tunnel barrier regions 514-1 and 514-2 at sufficiently low voltages but can be thin enough to allow energetic electrons to transit the metal 516 at sufficiently high voltages. In various embodiments, the thickness of metal material 516 is not greater than about 50 Angstroms. In one or more embodiments, the thickness of metal material 516 is not greater than about 20 Angstroms. In various embodiments, the work function of the metal material 516 is less than the work function of the metal materials 512 and 520.

The resistive memory cell 506 includes a resistive memory element 503 formed in series with the select device 501. The resistive memory element 503 includes a memory material 524 formed between a first memory element electrode 526 and a second memory element electrode 522. The memory material 524 can be, for instance, one or more resistance variable materials such as a transition metal oxide material or a perovskite including two or more metals, e.g., transition metals, alkaline earth metals, and/or rare earth metals. Other examples of resistance variable materials 524 associated with the storage element 503 of memory cell 506 can include chalcogenides, binary metal oxides, colossal magnetoresistive materials, and/or various polymer-based resistive variable materials, among others.

In the example illustrated in FIG. 5, the second memory element electrode 522 is in contact with, e.g., formed on, the second select device electrode 520. In this example, the first select device electrode 512 can serve as a first terminal of cell 506 and the first memory element electrode 526 can serve as a second terminal of cell 506. As such, in one or more embodiments, the cell terminals 512 and 526 can be, or can be coupled to, a word line and/or bit line corresponding to the cell 506. Embodiments are not limited to the example shown in FIG. 5. For instance, the resistive storage element 503 can be formed on the substrate 510 such that the order of the storage element 503 and the select device 501 is reversed.

The particular types of materials and thicknesses associated with select device 501 can depend on factors such as the characteristics of the memory cell 506. For instance, the particular characteristics of the select device 501, e.g., particular types of materials and thicknesses, can depend on the particular type of resistive memory cell 506 and/or type of memory material 524, e.g., resistance variable material, associated therewith. As such, the characteristics of the select device 501 can be tailored to achieve suitable differential resistance and I-V curve characteristics corresponding to the particular type of memory cell 506, e.g., RRAM, PCRAM, etc. As an example, the select device 501 can be tailored such that an on/off current ratio (Ion/Ioff) associated with the select device 501 responsive to a select voltage corresponding to a half select method, such as that described in FIG. 1, can be at least about $1 \times 10^4$ times greater than Ion/Ioff responsive to a half select voltage applied across the device 501. The Ion/Ioff ratio associated with select devices such as device 501 can be greater than the Ion/Ioff ratio associated with previous select devices, e.g., select devices having a metal-semiconductor-metal (MSM) configuration, metal-insulator-metal (MIM) configuration, metal-insulator-insulator-metal (MIIM) configuration, or metal-insulator-insulator-insulator-metal (MIIIM) configuration, etc. Select devices in accordance with embodiments described herein, such as select device 501, can provide such an Ion/Ioff ratio while supporting a higher current density as compared to such previous select devices. As an example, select devices such as the two terminal non-ohmic select device 501 can have an associated breakdown current density of at least $1 \times 10^5$ A/cm$^2$, for instance. The select device 501 can also have an associated HSR of least $1 \times 10^5$, for example.

In various embodiments, the select device 501 can be formed at temperatures sufficiently low to be compatible with various resistance variable materials associated with RRAM and/or other resistive memory cells. For instance, the select device can be formed at temperatures not greater than about 500° C., in some embodiments. As such, one or more select devices described herein can enable 3D stacking of memory arrays, such as array 100 illustrated in FIG. 1, which may have low temperature fabrication constraints.

Figure 6:
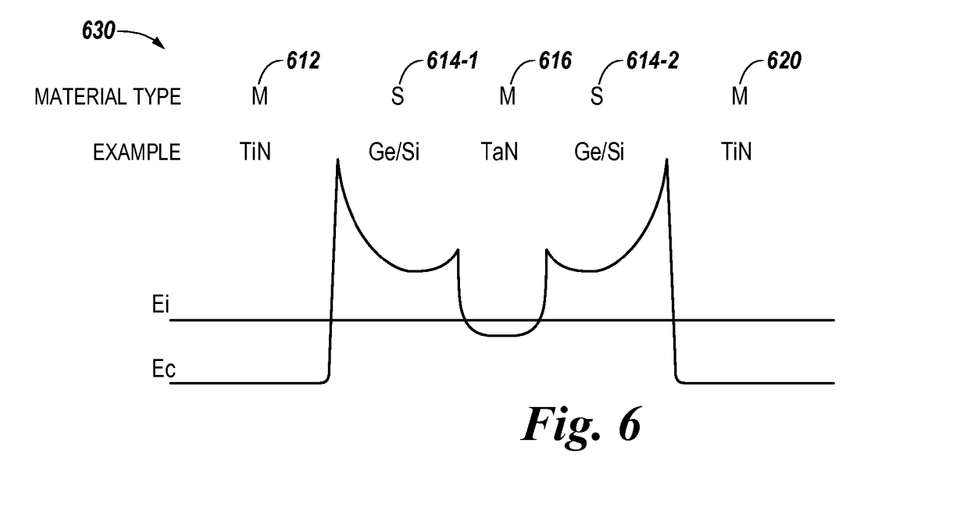
FIG. 6 illustrates an energy band diagram associated with a non-ohmic two terminal select device in accordance with one or more embodiments of the present disclosure.
Figure 7:
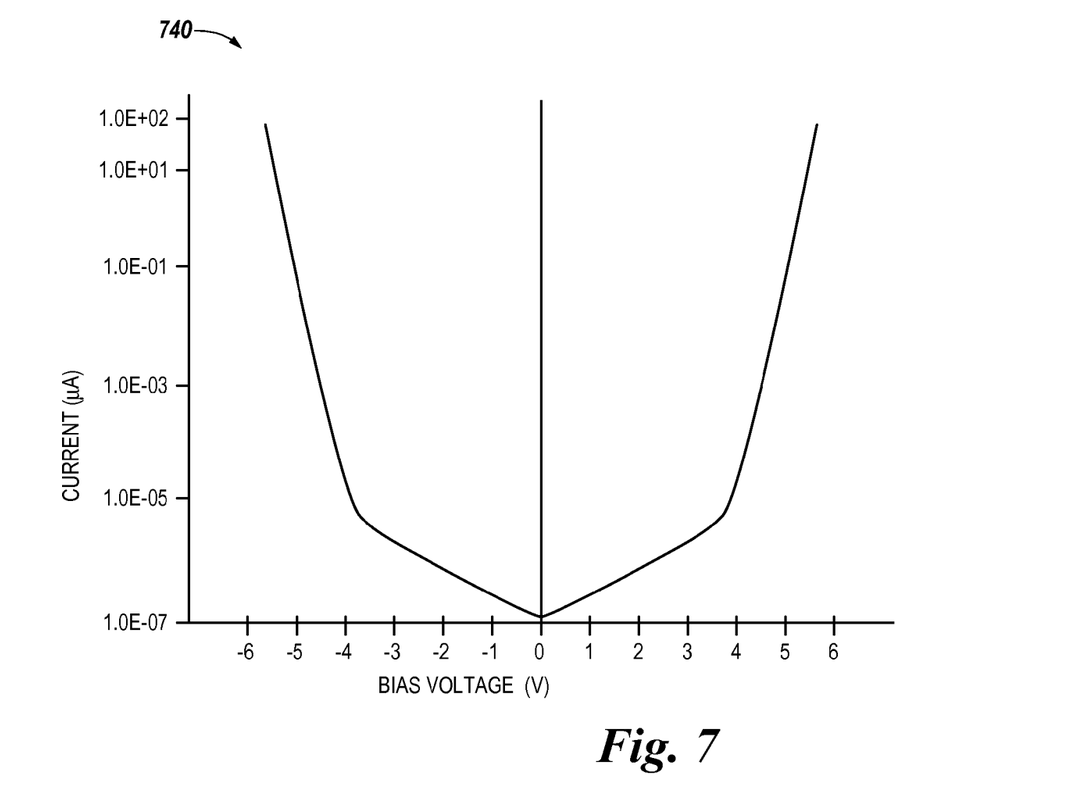
FIG. 7 illustrates a current versus voltage diagram associated with a non-ohmic two terminal select device in accordance with one or more embodiments of the present disclosure.

FIG. 6 illustrates an energy band diagram 630 associated with non-ohmic two terminal select device in accordance with one or more embodiments of the present disclosure. FIG. 7 illustrates a current versus voltage (I-V) diagram 740 associated with a non-ohmic two terminal select device in accordance with one or more embodiments of the present disclosure.

The select device corresponding to the energy band diagram 630 can be a select device such as select device 201 described in FIG. 2. As such, the select device can have a MSMSM configuration in which a metal material 616 is formed between at least two semiconductor tunnel barrier regions, e.g., 614-1 and 614-2, which are formed between a first and second terminal 612 and 620 of the select device. In diagram 630, Ei represents the intrinsic Fermi level and Ec represents the conduction band edge.

As one example, the terminals of the select device, e.g., electrodes 612 and 620, can be titanium nitride (TiN), the metal material 616 can be tantalum nitride (TaN), and the semiconductor tunnel barrier regions 614-1 and 614-2 can be germanium and/or silicon. As such, the select device includes four Schottky barrier junctions, e.g., between materials 612 and 614-1, between materials 614-1 and 616, between materials 616 and 614-2, and between materials 614-2 and 620. The use of Schottky barriers may inhibit electron transmission at low voltages, among other benefits.

As an example, the electrodes 612 and 620 can have a thickness of about 200 Angstroms, the tunnel barriers 614-1 and 614-2 can have a thickness of about 100 Angstroms, and the middle metal 616 can have a thickness of about 35 Angstroms; however, embodiments are not so limited. In various embodiments, the thickness of the middle metal 616 can be tuned to control a sharpness of an on current (Ion) condition associated with the select device. For instance, a sufficiently thin metal 616 can reduce inner barrier levels, which can allow double electron tunneling events at sufficiently high voltages (which increases the sharpness of the Ion condition). Increasing the thickness of metal 616 can reduce the Ion transition sharpness as bottom state electrons must transit a thicker region without interaction.

In various memory applications, it can be desirable for an I-V characteristic of a select device to provide a shallow differential resistance slope from 0V through +/−Von/2, where Von can be a select voltage associated with a resistive memory cell, for instance, and a steep differential resistance slope thereafter, e.g., from +/−Von/2 through Von, for instance. The I-V diagram 740 provides an example I-V diagram corresponding to one or more select devices described herein, e.g., the select device having the associated energy band diagram 630 described in FIG. 6. As illustrated in FIG. 6, the slope of I-V diagram 740 is shallow through about +/−4V and then sharply increases thereafter. As such, an array of memory cells having an associated half select voltage of about 3V or 4V will experience low leakage and disturb of half selected memory cells. As discussed above, one or more embodiments can provide a non-ohmic select device having an associated HSR of at least $1 \times 10^5$, for example. In various embodiments, the select device can support bi-directional current and can have a symmetric I-V curve associated therewith; however, embodiments are not so limited.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of Equivalents to which such claims are entitled.

In the foregoing Detailed Description, various features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:
1. A non-ohmic select device, comprising:
   at least two tunnel barrier regions formed between a first metal material and a second metal material;
   a third metal material formed between a first tunnel barrier region and a second tunnel barrier region of the at least two tunnel barrier regions; and
   a fourth metal material formed between the second tunnel barrier region and a third tunnel barrier region;
   wherein the non-ohmic select device is a two terminal select device that supports bi-directional current flow therethrough;
   wherein the first tunnel barrier region comprises a first semiconductor material formed in direct contact with the first metal material and the third metal material;

wherein the second tunnel barrier region comprises a second semiconductor material formed in direct contact with the second metal material and the fourth metal material; and wherein the third tunnel barrier region comprises a third semiconductor material formed in direct contact with the third metal material and the fourth metal material such that Schottky barrier junctions are formed at interfaces between the first tunnel barrier region and the first metal material, between the first tunnel barrier region and the third metal material, between the second tunnel barrier region and the fourth metal material, between the second tunnel barrier region and the second metal material, between the third tunnel barrier region and the third metal material, and between the third tunnel barrier region and the fourth metal material; and wherein at least one of the first and the second semiconductor materials comprises at least one semiconductor material selected from the group consisting of:
silicon; and
germanium.

2. The non-ohmic select device of claim 1, wherein the first metal material serves as a first terminal of the device and the second metal material serves as a second terminal of the select device.

3. The non-ohmic select device of claim 1, wherein the third metal material has a thickness configured to:
prevent electron tunneling between the at least two tunnel barrier regions responsive to a first voltage across the device; and
allow electron tunneling through the third metal material responsive to a second voltage across the device, the second voltage having a magnitude greater than the first voltage.

4. The non-ohmic select device of claim 3, wherein the thickness of the third metal material is not greater than about 50 Angstroms.

5. The non-ohmic select device of claim 3, wherein each of the at least two tunnel barrier regions have a thickness of less than about 100 Angstroms and the thickness of the third metal material is not greater than about 20 Angstroms.

6. The non-ohmic select device of claim 1, wherein at least one of the first and the second tunnel barrier regions includes at least two different materials.

7. The non-ohmic select device of claim 1, wherein an on/off current ratio (Ion/Ioff) associated with the device responsive to a first voltage applied across the device is at least $1 \times 10^4$ times greater than the on/off current ratio associated with the device responsive to a second voltage applied across the device.

8. A non-ohmic select device, comprising:
a first metal material formed between a first tunnel barrier region and a second tunnel barrier region of at least two tunnel barrier regions formed between a first electrode and a second electrode of the non-ohmic select device;
a second metal material formed between the second tunnel barrier region and a third tunnel barrier region of the at least two tunnel barrier regions;
wherein each of the at least two tunnel barrier regions include at least one semiconductor material;
wherein the first metal material has a thickness configured to:
prevent electron tunneling between the first and the third tunnel barrier regions responsive to a first voltage across the device; and
allow electron tunneling through the first metal material responsive to a second voltage across the device, the second voltage having a magnitude greater than the first voltage;

wherein the non-ohmic select device includes:
a first Schottky barrier junction at an interface between the first electrode and the first of the at least two tunnel barrier regions;
a second Schottky barrier junction at an interface between the first of the at least two tunnel barrier regions and the first metal material;
a third Schottky barrier junction at an interface between the first metal material and the third of the at least two tunnel barrier regions;
a fourth Schottky barrier junction at an interface between the second of the at least two tunnel barrier regions and the second electrode;
a fifth Schottky barrier junction at an interface between the second metal material and the second tunnel barrier region; and
a sixth Schottky barrier junction at an interface between the second metal material and the third tunnel barrier region; and
wherein the first and the second electrodes are metal electrodes.

9. The non-ohmic select device of claim 8, wherein at least one of the metal material, the first electrode, and the second electrode includes a metal silicide.

10. The non-ohmic select device of claim 8, wherein a work function associated with the metal material is less than a work function associated with the first electrode and a work function associated with the second electrode.

11. The non-ohmic select device of claim 8, wherein the first and the second electrode comprise the same material.

12. The non-ohmic select device of claim 8, wherein a breakdown current density associated with the device is at least $1 \times 10^5$ A/cm$^2$.

13. The non-ohmic select device of claim 8, wherein the device includes at least three tunnel barrier regions formed between the first and second electrodes.

14. The non-ohmic select device of claim 8, wherein the device includes three tunnel barrier regions formed between the first and second electrodes, and wherein a middle tunnel barrier region of the three tunnel barrier regions comprises an undoped semiconductor material and the other two tunnel barrier regions comprise a doped semiconductor material.

15. A resistive memory cell, comprising:
a two terminal non-ohmic select device in series with a resistive memory element; wherein the two terminal non-ohmic select device includes:
at least two tunnel barrier regions formed between a first select device electrode comprising a first metal material and a second select device electrode comprising a second metal material; and
a third metal material formed between a first tunnel barrier region and a second tunnel barrier region of the at least two tunnel barrier regions; and
a fourth metal material formed between the second tunnel barrier region and a third tunnel barrier region;
wherein the resistive memory element includes a memory material formed between a first memory element electrode and a second memory element electrode, with the second memory element electrode in contact with the second select device electrode;
wherein the first select device electrode serves as a first cell terminal and the first memory element electrode serves as a second cell terminal;

wherein the first tunnel barrier region of the at least two tunnel barrier regions includes a first semiconductor material in direct contact with the first select device electrode;

wherein the second tunnel barrier region of the at least two tunnel barrier regions includes a second semiconductor material in direct contact with the second select device electrode;

wherein the first and second semiconductor materials are in direct contact with the third metal material and the fourth metal material, respectively;

wherein the third tunnel barrier region includes a third semiconductor material in direct contact with the third metal material and the fourth metal material; and wherein at least one of the first and the second semiconductor materials comprises at least one semiconductor material selected from the group consisting of:

silicon; and germanium.

16. The resistive memory cell of claim 15, wherein a breakdown current density associated with the non-ohmic select device is at least $1 \times 10^5$ A/cm$^2$.

17. The resistive memory cell of claim 15, wherein the memory material comprises at least one of a phase change material, a transition metal oxide material, and a perovskite material.

18. The resistive memory cell of claim 15, wherein a differential resistance of the non-ohmic select device decreases with increasing applied voltage.

19. The resistive memory cell of claim 15, wherein the non-ohmic select device has an associated half select ratio (HSR) of at least $1 \times 10^5$.

20. A method of forming a two terminal non-ohmic select device, comprising:

forming a first metal material between a first tunnel barrier region and a second tunnel barrier region of at least two tunnel barrier regions formed between a first electrode and a second electrode of the two terminal non-ohmic select device;

forming a second metal material between the second tunnel barrier region and a third tunnel barrier region of the at least two tunnel barrier regions;

wherein the first metal material has a thickness configured to:

prevent electron tunneling between the first and the third tunnel barrier regions responsive to a first voltage across the device; and allow electron tunneling through the first metal material responsive to a second voltage across the device, the second voltage having a magnitude greater than the first voltage;

wherein the non-ohmic select device includes:

a first Schottky barrier junction at an interface between the first electrode and the first of the at least two tunnel barrier regions;

a second Schottky barrier junction at an interface between the first of the at least two tunnel barrier regions and the first metal material;

a third Schottky barrier junction at an interface between the first metal material and the third of the at least two tunnel barrier regions;

a fourth Schottky barrier junction at an interface between the second of the at least two tunnel barrier regions and the second electrode;

a fifth Schottky barrier junction at an interface between the second metal material and the second tunnel barrier region; and a sixth Schottky barrier junction at an interface between the second metal material and the third tunnel barrier region.

21. The method of claim 20, including forming the two terminal non-ohmic select device at a temperature not greater than about 500° C.

22. A method of forming a resistive memory cell of an array of resistive memory cells, the method comprising:

forming a first electrode and a second electrode of a two terminal non-ohmic select device, the first electrode comprising a first metal material and the second electrode comprising a second metal material;

forming a first tunnel barrier region in direct contact with the first electrode;

forming a third metal material in direct contact with the first tunnel barrier;

forming a second tunnel barrier region in direct contact with the second electrode and a fourth metal material;

forming a fourth metal material between the second tunnel barrier region and a third tunnel barrier region; and forming a resistive element having a memory material between a first memory element electrode and a second memory element electrode, the first memory element electrode in contact with at least one of the first and the second electrode of the two terminal non-ohmic select device;

wherein an on/off current ratio (Ion/Ioff) corresponding to the two terminal non-ohmic select device responsive to an applied select voltage associated with the array is at least $1 \times 10^4$ times greater than the on/off current ratio corresponding to the two terminal non-ohmic select device responsive to a half select voltage associated with the array;

wherein the first and the second tunnel barrier regions include a semiconductor material such that Schottky barrier junctions are formed at interfaces between the first tunnel barrier region and the first electrode, between the first tunnel barrier region and the third metal material, between the second tunnel barrier region and the fourth metal material, between the second tunnel barrier region and the second electrode;

wherein the third tunnel barrier region includes a semiconductor material such that Schottky barrier junctions are formed at interfaces between the third tunnel barrier region and the third metal material, and between the third tunnel barrier and the fourth metal material;

wherein the semiconductor material of first tunnel barrier region is formed in direct contact with the third metal material, and wherein the semiconductor material of the third tunnel barrier region is formed in direct contact with the third metal material and the fourth metal material; and wherein at least one of the semiconductor material of the first tunnel barrier region and the semiconductor material of the second tunnel barrier region comprises at least one semiconductor material selected from the group consisting of:

silicon; and germanium.

23. The method of claim 22, wherein forming the metal material includes tuning a thickness of the metal material such that the two terminal non-ohmic select device has a half select ratio (HSR) associated with the resistive memory cell of at least $1 \times 10^4$.

24. The non-ohmic select device of claim 1, wherein each of the first, the second, and the third semiconductor materials comprises at least one semiconductor material selected from the group consisting of:
   silicon; and
   germanium.

25. The non-ohmic select device of claim 1, wherein each of the first, the second, and the third semiconductor materials comprises silicon.

26. The non-ohmic select device of claim 1, wherein each of the first, the second, and the third semiconductor materials comprises germanium.

27. The non-ohmic select device of claim 8, wherein the first and the second tunnel barrier regions comprise a doped semiconductor material, and wherein the third tunnel barrier region comprises an undoped semiconductor material.

28. The non-ohmic select device of claim 8, wherein the first and the second tunnel barrier regions comprise doped silicon, and wherein the third tunnel barrier region comprises intrinsic polysilicon.

\* \* \* \* \*